United States Patent
Le et al.

(10) Patent No.: US 12,254,655 B2
(45) Date of Patent: Mar. 18, 2025

(54) LOW-POWER FAST-RESPONSE MACHINE LEARNING VARIABLE IMAGE COMPRESSION

(71) Applicant: Western Digital Technologies, Inc., San Jose, CA (US)

(72) Inventors: Quang Le, San Jose, CA (US); Rajeev Nagabhirava, Santa Clara, CA (US); Kuok San Ho, Redwood City, CA (US); Daniel Bai, Freemont, CA (US); Xiaoyong Liu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 598 days.

(21) Appl. No.: 17/362,427

(22) Filed: Jun. 29, 2021

(65) Prior Publication Data

US 2022/0414942 A1 Dec. 29, 2022

(51) Int. Cl.
*G06T 9/00* (2006.01)
*G01S 17/89* (2020.01)
(Continued)

(52) U.S. Cl.
CPC .............. *G06T 9/002* (2013.01); *G01S 17/89* (2013.01); *G06N 3/065* (2023.01); *G06N 3/08* (2013.01); *G06T 7/20* (2013.01); *G11C 11/155* (2013.01)

(58) Field of Classification Search
None
See application file for complete search history.

(56) References Cited

U.S. PATENT DOCUMENTS 7,167,519 B2 1/2007 Comaniciu et al.
8,427,538 B2 4/2013 Ahiska
(Continued)

FOREIGN PATENT DOCUMENTS

EP 3451293 A1 * 3/2019 ........... G06N 3/0454

OTHER PUBLICATIONS

Chen, R. et al, "Improving the accuracy and low-light performance of contrast-based autofocus using supervised machine learning", Pattern Recognition Letters, vol. 56, Apr. 15, 2015, pp. 30-37.
(Continued)

*Primary Examiner* — Delomia L Gilliard
(74) *Attorney, Agent, or Firm* — Patent Law Works LLP

(57) ABSTRACT

Computing devices, such as mobile computing devices, have access to one or more image sensors that can capture images and video with multiple subjects. Some of these subjects may vary in priority for various tasks. It may be desired to increase or decrease the compression on each subject in order to more efficiently store the image data. Low-power, fast-response machine learning logic can be configured to allow for the generation of a plurality of inference data. Inference data can be associated with the type, motion and/or priority of the subjects as desired. This inference data can be utilized along with other subject data to generate one or more variable compression regions within the image data. The image data can be subsequently processed to compress different areas of the image based on a desired application. The variably compressed image can reduce file sizes and allow for more efficient storage and processing.

26 Claims, 11 Drawing Sheets

(51) Int. Cl.
  *G06N 3/065* (2023.01)
  *G06N 3/08* (2023.01)
  *G06T 7/20* (2017.01)
  *G11C 11/155* (2006.01)

(56) References Cited

U.S. PATENT DOCUMENTS

| | | | |
|---|---|---|---|
| 8,472,798 B2 | 6/2013 | Molin et al. | |
| 8,830,339 B2 | 9/2014 | Velarde et al. | |
| 9,137,418 B2 * | 9/2015 | Tsugimura | H04N 1/41 |
| 11,790,665 B2 * | 10/2023 | Bangalore Ramaiah | G06V 20/588 |
| | | | 382/104 |
| 2008/0140603 A1 * | 6/2008 | Babikov | G06F 16/289 |
| | | | 707/E17.108 |
| 2014/0185103 A1 * | 7/2014 | Tsugimura | H03N 1/41 |
| | | | 358/426.09 |
| 2017/0337711 A1 * | 11/2017 | Ratner | H04N 19/119 |
| 2020/0007746 A1 | 1/2020 | Cao et al. | |
| 2020/0079388 A1 * | 3/2020 | Kenyon | G08G 1/0129 |
| 2020/0082522 A1 * | 3/2020 | Bonneau | G08B 21/18 |
| 2020/0082885 A1 * | 3/2020 | Lin | H01L 23/5226 |
| 2020/0151539 A1 * | 5/2020 | Oh | G06N 5/04 |
| 2020/0195837 A1 * | 6/2020 | Miu | G02B 27/0075 |
| 2020/0235288 A1 * | 7/2020 | Ikegawa | H10N 50/01 |
| 2020/0244997 A1 * | 7/2020 | Galpin | G06N 3/084 |
| 2020/0348665 A1 * | 11/2020 | Bhanushali | H04N 19/167 |
| 2022/0261616 A1 * | 8/2022 | Li | G06N 3/04 |
| 2022/0319019 A1 * | 10/2022 | Maharana | G06F 18/22 |
| 2022/0358744 A1 * | 11/2022 | Bae | G06T 7/246 |
| 2022/0414942 A1 * | 12/2022 | Le | G01S 17/58 |
| 2023/0040068 A1 * | 2/2023 | Gandhi | H04N 23/68 |

OTHER PUBLICATIONS

James, A. et al., "Smart cameras everywhere: AI vision on edge with emerging memories," 2019 26th IEEE International Conference on Electronics, Circuits and Systems (ICECS), 2019, pp. 422-425, doi: 10.1109/ICECS46596.2019.8965029.

Kim, Y. et al, "ORCHARD: Visual Object Recognition Accelerator Based on Approximate In-Memory Processing" 2017 IEEE.

Mudassar, B. A. et al., "CAMEL: An Adaptive Camera With Embedded Machine Learning-Based Sensor Parameter Control," in IEEE Journal on Emerging and Selected Topics in Circuits and Systems, vol. 9, No. 3, pp. 498-508, Sep. 2019, doi: 10.1109/JETCAS.2019.2935207.

Pen, Liang, "Enhanced Camera Capturing Using Object-Detection-Based Autofocus on Smartphones", 2016 4th Intl Conf on Applied Computing and Information Technology/3rd Intl Conf on Computational Science/Intelligence and Applied Informatics/1st Intl Conf on Big Data, Cloud Computing, Data Science & Engineering.

Wang, C. et al., "Intelligent Autofocus", Feb. 27, 2020.

Peng, Liang, "Enhanced Camera Capturing Using Object-Detection-Based Autofocus on Smartphones", 2016 4th Intl Conf on Applied Computing and Information Technology/3rd Intl Conf on Computational Science/Intelligence and Applied informatics/1st Intl Conf on Big Data, Cloud Computing, Data Science & Engineering.

* cited by examiner

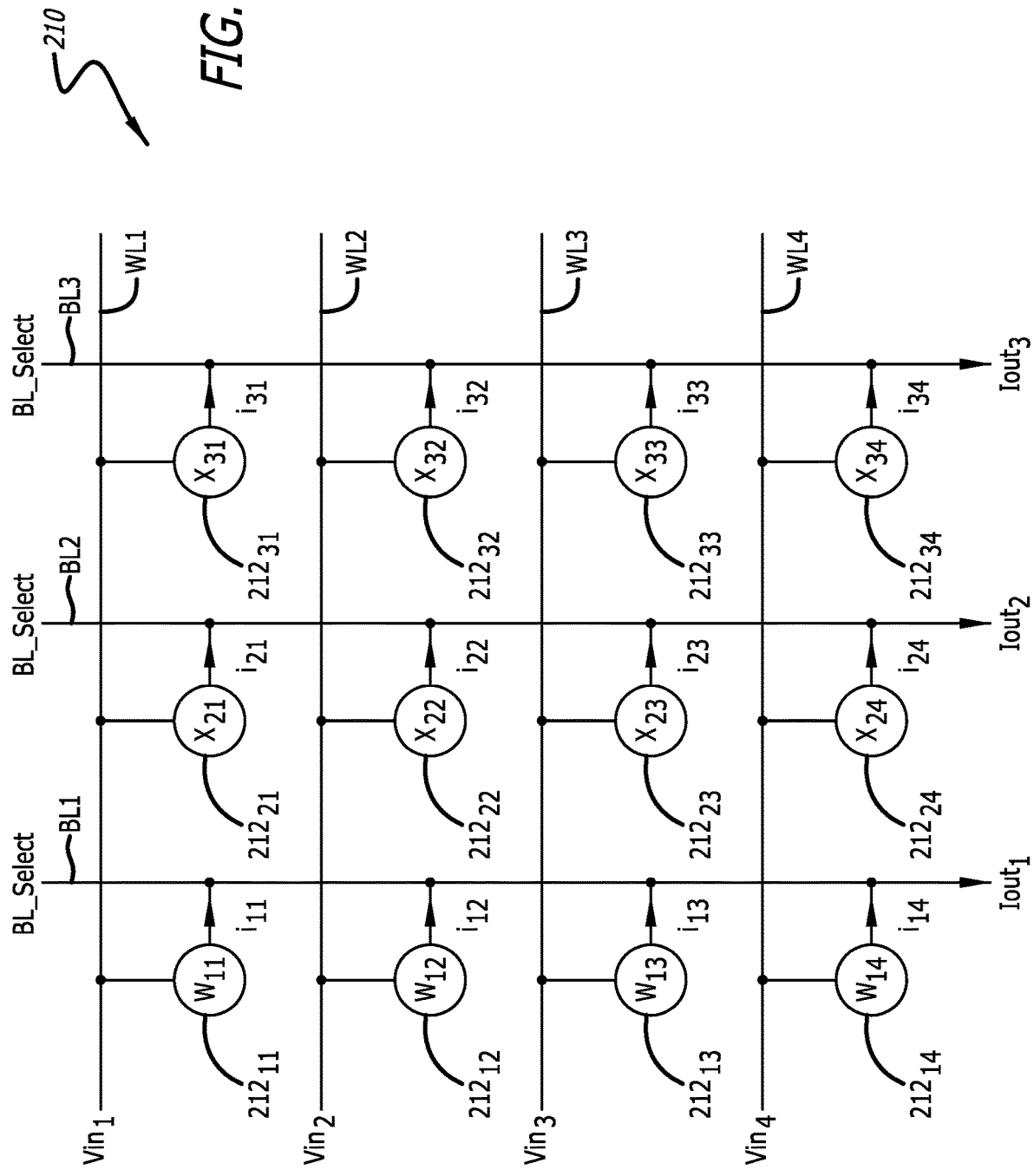

LOW-POWER FAST-RESPONSE MACHINE LEARNING VARIABLE IMAGE COMPRESSION

FIELD

The present disclosure relates to image processing. More particularly, the present disclosure relates to utilizing low-power machine learning-based systems to provide fast-response variable compression of captured images.

BACKGROUND

As technology has grown over the last decade, the growth of image data such as video content has increased dramatically, especially with the decreasing size and cost of utilizing image sensors on a variety of devices. This increase in image data has generated a greater demand for automatic classification and optimization, especially as image data is captured with during more mission critical processes such as assisted driving. In response, neural networks and other artificial intelligence methods have been increasingly utilized to generate automatic classifications, detections, and other optimizations.

However, as image data and the neural networks used to analyze them have increased in size and complexity, a higher computational and power demand is created. More data to process requires more time to process all of the data. Likewise, more complex neural networks require more processing power to parse the data. Traditional methods of handling these problems include trading a decrease in output accuracy for increased processing speed, or conversely, increasing the output accuracy for a decrease in processing speed. Furthermore, the proliferation of this image data has created a stronger demand for image data storage. However, not all image data is necessary for storage.

SUMMARY

Systems and methods for variably compressing image data utilizing low-power, fast-response machine learning logic in accordance with embodiments of the invention are disclosed herein. In many embodiments, a device includes an image sensor, a Non-Volatile Memory (NVM) and a processor. The processor can be configured to direct the device to receive image data from the image sensor for processing and pass the received image data to a machine learning model. The device may then recognize a plurality of subjects within the image data, determine a region for each recognized subject, and classify the recognized subjects into one or more compression groups. For each one of the compression groups, a unique level of compression may be selected. Once selected, the device can compress the region of image data associated with each recognized subject according to the selected level of compression for the classified compression group. The compression can include at least a portion of the remaining image data utilizing a predetermined level of compression, the predetermined level being different from a selected unique level of compression associated with one of the one or more compression groups. Once variably compressed, the device can store the variably compressed image data in the NVM.

In further embodiments, the one or more compression groups are based on the relative motion of the recognized subjects.

In yet further embodiments, the processor comprises a machine learning processor comprising a plurality of non-volatile memory cells to store weights for the machine learning model, and wherein the machine learning processor is configured to apply signals corresponding to the received image data, via one or more signal lines associated with the memory cells, to the memory cells, to generate a plurality of inferences for processing the image data.

In more embodiments, the non-volatile memory cells are Spin-Orbit Torque Magnetoresistive Random-Access Memory (SOT MRAM) memory cells.

In additional embodiments, the classification of the recognized subjects utilizes previously processed image data.

In still further embodiments, the device is configured to continue capturing image data until the optimization of the known subject within the image data exceeds a predetermined threshold.

In still additional embodiments, the device is further configured to generate subject data for each recognized subject.

In yet further embodiments, the subject data comprises subject size, subject motion speed, or subject motion direction.

In a series of embodiments, the classification of the recognized subjects utilizes previously generated subject data.

In various embodiments, the predetermined level of compression is a higher level of compression than the selected unique levels of compression.

In a number of embodiments, the determined region is a bounding box encasing the recognized subject.

In more embodiments, the determined region is a pixel mask covering the recognized subject.

In still more embodiments, the image sensor is disposed on an automobile.

In further additional embodiments, the image sensor comprises a plurality of varying focal length image sensors.

In still more embodiments, the image sensor further comprises a Light Detection and Ranging (LiDAR) camera.

In another series of embodiments, the recognized subjects are high-priority subjects associated with automobile driving.

In certain embodiments, the high-priority subjects include pedestrians, automobiles, or traffic signs.

In particular embodiments, the variably compressed image data is streamed to a cloud-based computing device.

In yet more embodiments, a method for variably compressing image data includes receiving image data, passing the received image data to a machine learning model, and processing the image data within the machine learning model to generate a plurality of inferences. These inferences can be used to recognize a plurality of dynamically moving subjects within the image data, generate a region of image data for each recognized subject, determine the relative speed of each recognized subject, and select a level of compression for each of the plurality of subjects based on that determined speed. The method may then compress each generated region of image data according to the selected level of compression associated with the corresponding subject and further compress at least a portion of the remaining image data utilizing a predetermined level of compression, the predetermined level being different from the selected level of compression for at least one of the plurality of recognized subjects.

In more various embodiments, the plurality of inferences are generated in less than one millisecond.

In additional embodiments again, the selected levels of compression are grouped into one or more categories.

In still yet further embodiments, a device includes a processor to direct the device to receive image data for processing, pass the received image data to a machine learning model, and recognize a plurality of subjects within the image data. The device can then generate a first region of the image data based on the recognized subjects and generate a second region of the image data comprising the remaining image data. Finally, the device can compress the image data in the first region at a first compression level and compress the image data in the second region at a second compression level different from the first compression level.

In some particular embodiments, the device further comprises a Non-Volatile Memory (NVM) communicatively coupled to the processor, wherein the processor is further configured to cause the device to store the variably compressed image data in the NVM In a number of various embodiments, the processor is further configured to cause the device to send the variably compressed image data to a cloud-based computing device Although the description above contains many specificities, these should not be construed as limiting the scope of the invention but as merely providing illustrations of some of the presently preferred embodiments of the invention. Various other embodiments are possible within its scope. Accordingly, the scope of the invention should be determined not by the embodiments illustrated, but by the appended claims and their equivalents.

BRIEF DESCRIPTION OF DRAWINGS

The above, and other, aspects, features, and advantages of several embodiments of the present disclosure will be more apparent from the following description as presented in conjunction with the following several figures of the drawings.

FIG. 1C is an example cross-point memory array suitable for performing the matrix-vector multiplication operation depicted in FIG. 1B in accordance with various embodiments of the disclosure is shown in accordance with an embodiment of the disclosure;

Figures 1A, 1B:
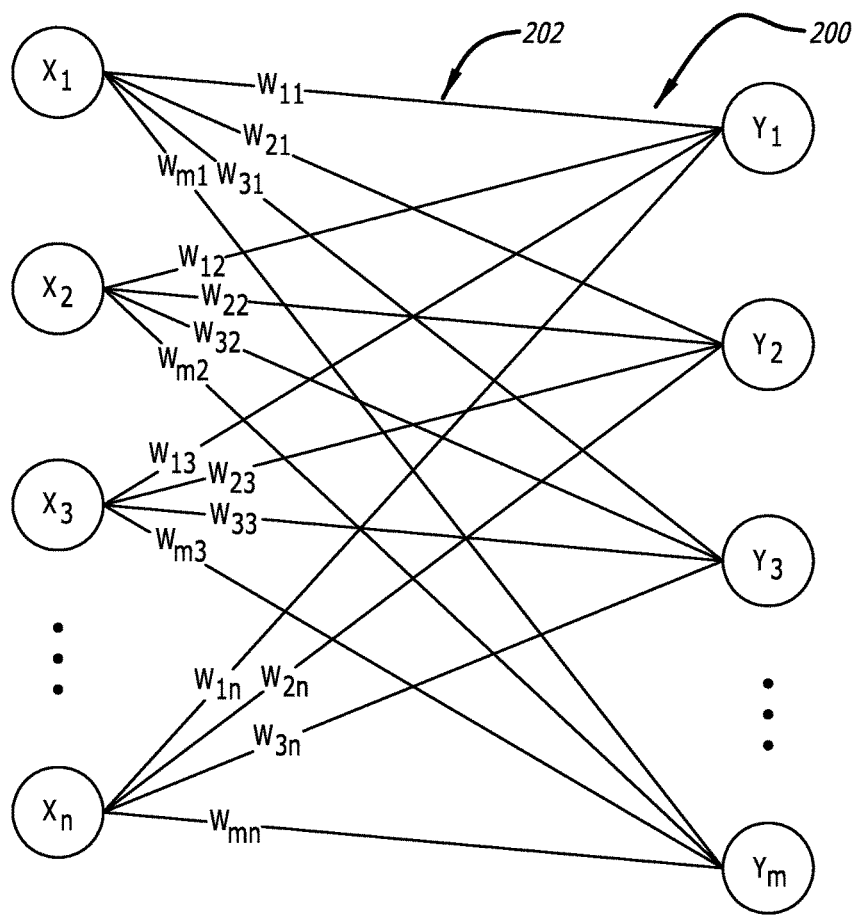
FIG. 1A is conceptual diagram of an artificial neural network in accordance with an embodiment of the disclosure.
FIG. 1B depicts a matrix-vector multiplication operation of the artificial neural network of FIG. 1A in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that reduce image data storage requirements by variably compressing image data utilizing one or more low-power, fast-response machine learning methods. Variable compression can be accomplished in a number of ways. Embodiments discussed herein can select regions within the image data to compress at various rates based on a number of factors. In many embodiments, the selection of compression level of regions within image data can be based on the relative motion of subject identified within the image data. In further embodiments, each subject can be assigned a priority status which can be utilized to determine the proper level of compression. In still yet further embodiments, one or more logics can be configured to identify desired subjects within image data and compress them at a lower rate than the remaining, background image data.

In a number of embodiments, the variable compression can be utilized to better process data for specific tasks such as, but not limited to, assisted driving. In these embodiments, the image data that is captured by an automobile or other vehicle is analyzed and segmented between identified subjects. The subjects identified can be pedestrians, other vehicles, traffic signs/lights, etc. The relative importance of these subjects can be utilized to determine a compression level to apply to the subjects. Each subject may be compressed individually or may be grouped together within a region to compress. This can lead to image data that has variable levels of compression associated with different regions within each frame of image data. This variable compression can allow for reduced file size and thus ease of storage and processing.

The ability to process image data as described above can be accomplished within mobile computing devices and other reduced-size devices (such as those disposed within automobiles and other vehicles) by utilizing low-power, fast-response machine learning methods. As described in more detail below, methods of processing image data may require processing in time frames that are not available in typical time frames that would allow for the proper analysis of video speed image data. Similarly, providing the speed for sufficient image data processing can require inefficient or otherwise unsuitable levels of power. Therefore, methods described below can allow for the efficient processing speed of image data while still allowing for low-power usage. In many embodiments, this can provide a means to variably compress image data in smaller and more diverse types of devices, such as, but not limited to portable computing devices and automobiles or other vehicles.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A depicts a conceptual example of an artificial neural network 100 that includes input neurons $x_1$, $x_2$, $x_3$, ..., $x_n$, output neurons $y_1$, $y_2$, $y_3$, ..., $y_m$, and synapses 102 that connect input neurons $x_1$, $x_2$, $x_3$, ..., $x_n$, to output neurons $y_1$, $y_2$, $y_3$, ..., $y_m$. In an embodiment, each synapse 102 has a corresponding weight $w_{11}$, $w_{12}$, $w_{13}$, ..., $w_{nm}$.

In an embodiment, each input neuron $x_1$, $x_2$, $x_3$, ..., $x_n$ has an associated value, each output neuron $y_1$, $y_2$, $y_3$, ..., $y_m$ has an associated value, and each weight $w_{11}$, $w_{12}$, $w_{13}$, ..., $w_{nm}$ has an associated value. The value of each output neuron $y_1$, $y_2$, $y_3$, ..., $y_m$ may be determined as follows:

$$y_k = \sum_{j=1}^{n} x_j w_{kj}, k = 1, 2, \ldots, m \qquad (1)$$

In matrix notation, equation (1) may be written as $y = x^T W$, where y is an m-element output vector, x is an n-element input vector, and W is an n×m array of weights, as depicted in FIG. 1B.

The matrix-vector multiplication operation depicted in FIG. 1B may be implemented by utilizing multiplication and accumulation operations, in which each output neuron $y_1$, $y_2$, $y_3$, ..., $y_m$ has an associated value equal to the sum of products of each input neuron $x_1$, $x_2$, $x_3$, ..., $x_n$ with the corresponding weight $w_{11}$, $w_{12}$, $w_{13}$, ..., $w_{nm}$ that connects each respective input neuron $x_1$, $x_2$, $x_3$, ..., $x_n$ to the output neuron $y_1$, $y_2$, $y_3$, ..., $y_m$.

In a number of embodiments, a cross-point memory array can be used to perform the multiplication and accumulation operations described above. Referring to FIG. 1C, an example cross-point memory array suitable for performing the matrix-vector multiplication operation depictured in FIG. 1B in accordance with various embodiments of the disclosure is shown. In many embodiments, the cross-point memory array 110 that may be utilized to perform matrix-vector multiplication operations such as those depicted in FIG. 1B.

In various embodiments, the cross-point memory array 110 may include n rows and m columns of nodes $112_{11}$, $112_{12}$, ..., $112_{34}$. Each row of these nodes $112_{11}$, $112_{12}$, ..., $112_{34}$ can be coupled to one of n first conductive lines (e.g., word lines ($WL_1$, $WL_2$, $WL_3$, $WL_4$). Additionally, each column of nodes $112_{11}$, $112_{12}$, ..., $112_{34}$ is coupled to one of m second conductive lines (e.g., bit lines $BL_1$, $BL_2$, $BL_3$). Those skilled in the art will understand that cross-point memory arrays may include more or fewer than four word lines, and as well as fewer than three bit lines, and can have more or fewer than twelve nodes as depicted herein.

In certain embodiments, each node $112_{11}$, $112_{12}$, ..., $112_{34}$ of a cross-point memory array 110 may include a non-volatile memory cell having an adjustable resistance. In further embodiments, the non-volatile memory cells in nodes $112_{11}$, $112_{12}$, ..., $112_{34}$ may be programmed to store a corresponding weight of an n×m array of weights $w_{11}$, $w_{12}$, $w_{13}$, ..., $w_{34}$, respectively. Thus, each node $112_{11}$, $112_{12}$, ..., $112_{34}$ is labeled with a corresponding weight $w_{11}$, $w_{12}$, $w_{13}$, ..., $w_{34}$, respectively, programmed in the corresponding non-volatile memory cell of the node. In an embodiment, each weight $w_{11}$, $w_{12}$, $w_{13}$, ..., $w_{34}$ corresponds to a conductance of the non-volatile memory cell in each node $112_{11}$, $112_{12}$, ..., $112_{34}$, respectively. The weights may be programmed, for example, during a training phase of the neural network. A common training method involves the weights being selectively and/or iteratively updated using an algorithm such as, but not limited to, back propagation.

Input voltages $Vin_1$, $Vin_2$, $Vin_3$ and $Vin_4$ are shown applied to word lines $WL_1$, $WL_2$, $WL_3$, $WL_4$, respectively. The magnitudes of input voltages $Vin_1$, $Vin_2$, $Vin_3$ and $Vin_4$ can correspond to the associated values of input neurons $x_1$, $x_2$, $x_3$ and $x_4$, respectively. A bit line select voltage (BL_Select) can be applied to each bit line to select that bit line. For ease of explanation, it will be assumed that BL_Select is zero volts, such that the voltage across the non-volatile memory cell in each node $112_{11}$, $112_{12}$, ..., $112_{34}$ is the word line voltage.

In some embodiments, the non-volatile memory cells in nodes $112_{11}$, $112_{12}$, ..., $112_{34}$ conduct currents $i_{11}$, $i_{12}$, ..., $i_{34}$, respectively. Each of the currents $i_{11}$, $i_{12}$, ..., $i_{34}$ is based on the voltage applied to the corresponding non-volatile memory cell and the conductance of the corresponding non-volatile memory cell in the node. This "memory cell current" may then flow to the bit line connected to the non-volatile memory cell. The memory cell current can often be determined by multiplying the word line voltage by the conductance of the non-volatile memory cell.

Stated another way, each non-volatile memory cell current corresponds to the result of multiplying one of the elements of an input vector by the weight stored in the non-volatile memory cell. So, for example, a non-volatile memory cell in node $112_{11}$ conducts a current $i_{11}$ that corresponds to the product $Vin_1 \times w_{11}$, the non-volatile memory cell in node $112_{12}$ conducts a current $i_{12}$ that corresponds to the product $Vin_2 \times w_{12}$, the non-volatile memory cell in node $112_{23}$ conducts a current $i_{23}$ that corresponds to the product $Vin_3 \times w_{23}$, and so on.

Bit lines $BL_1$, $BL_2$, $BL_3$ may conduct bit line currents $Iout_1$, $Iout_2$, $Iout_3$, respectively. Each bit line current can be understood as the summation of the currents of the memory cells connected to that bit line. For example, bit line current $Iout1 = i_{11} + i_{12} + i_{13} + i_{14}$, bit line current $Iout_2 = i_{21} + i_{22} + i_{23} + i_{24}$, and bit line current $Iout_3 = i_{31} + i_{32} + i_{33} + i_{34}$. Thus, each bit line current $Iout_1$, $Iout_2$, $Iout_3$ may be viewed as representing a sum of products of the input vector with corresponding weights in a column of the n×m array of weights:

The magnitudes of bit line currents $Iout_1$, $Iout_2$ and $Iout_3$ may constitute elements of an output vector and correspond to the associated values of output neurons $y_1$, $y_2$ and $y_3$, respectively. This can thus constitute the result of a matrix-vector multiplication operation such as the one depicted in FIG. 1B.

Figure 2:
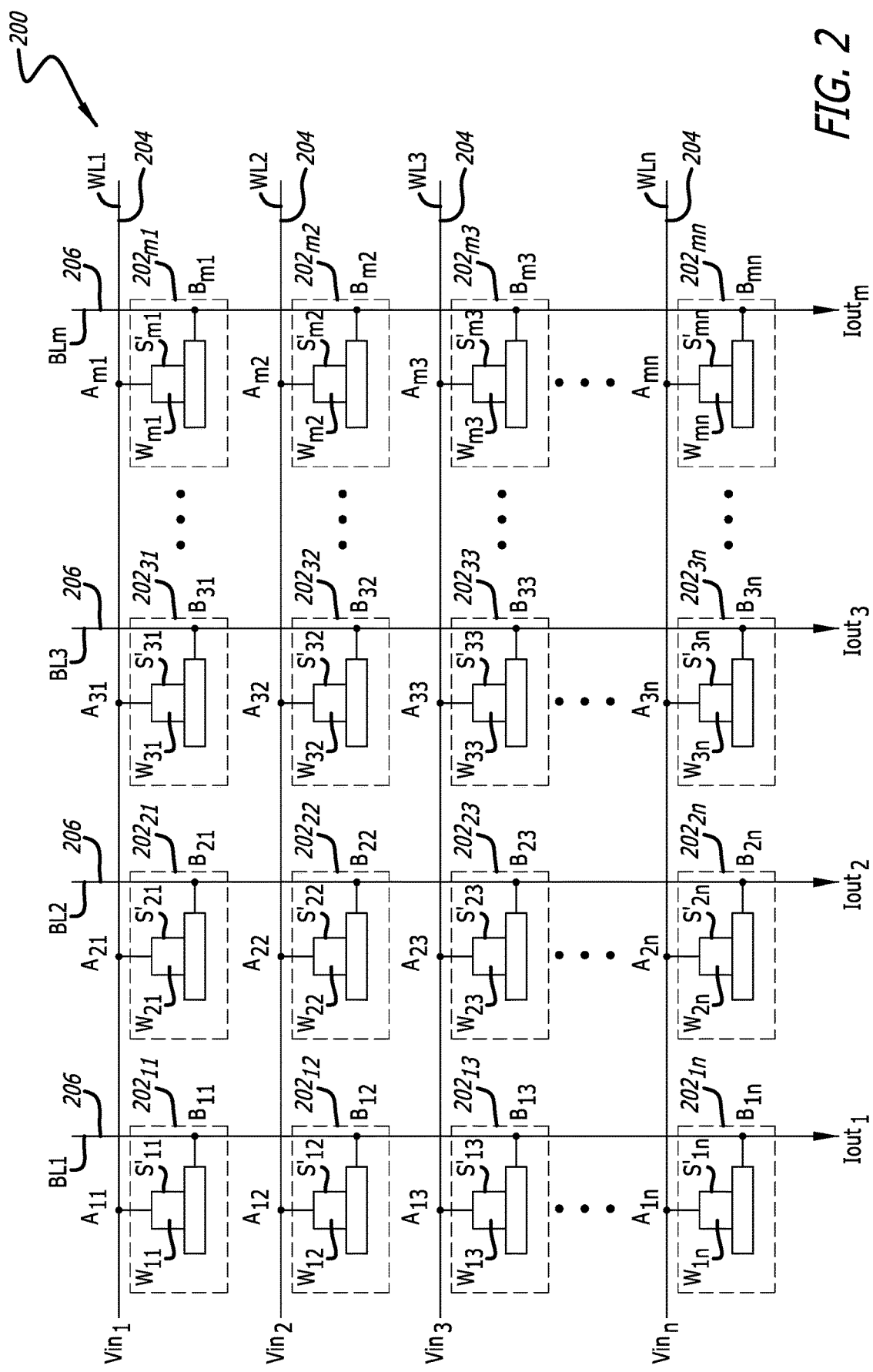
FIG. 2 is conceptual cross-point memory array that may be utilized within a low-power fast-response machine learning system according to various embodiments of the disclosure.

Referring to FIG. 2, a conceptual cross-point memory array 200 that may be utilized within a low-power fast-response machine learning system according to various embodiments of the disclosure is shown. In many embodiments, the cross-point memory array 200 depicted in FIG. 2 may be utilized to perform matrix-vector multiplication operations such as those depicted in FIG. 1B. Often, the cross-point memory array can be configured for use within a memory system and/or a specialized processing unit. Various embodiments of the disclosure herein utilize a cross-point memory array 200 for use in low-power, fast-response machine learning systems for the generation of a plurality of inferences regarding image data in a short amount of time.

Cross-point memory array 200 can include n rows and m columns of nodes $202_{11}$, $202_{12}$, ..., $202_{mn}$. In most embodiments, each of the nodes $202_{11}$, $202_{12}$, ..., $202_{mn}$ can include a corresponding non-volatile memory cell $S'_{11}$, $S'_{12}$, ..., $S'_{mn}$, respectively. In other embodiments, the cross-point memory array 200 may include more than one non-volatile memory cell per node.

Each row of nodes $202_{11}$, $202_{12}$, ..., $202_{mn}$ may be coupled to one of n first conductive lines 204, also referred to herein as word lines $WL_1$, $WL_2$, ..., WLn 204. For example, in the embodiment depicted in FIG. 2, the row of nodes $202_{11}$, $202_{21}$, $202_{31}$, ..., $202_{m1}$ is coupled to word line WL1, the row of nodes $202_{13}$, $202_{23}$, $202_{33}$, ..., $202_{m3}$ is coupled to word line $WL_3$, and so on.

In further embodiments, each column of nodes $202_{11}$, $202_{12}$, ..., $202_{mn}$ may also be coupled to one of m second conductive lines 206, also referred to herein as bit lines BL1, BL2, ..., BLm. For example, as depicted in FIG. 2, the column of nodes $202_{11}$, $202_{12}$, $202_{13}$, ..., $202_{1n}$ is coupled to bit line BL1, the column of nodes $202_{21}$, $202_{22}$, $202_{23}$, ..., $202_{2n}$ is coupled to bit line BL2, and so on.

Each non-volatile memory cell $S'_{11}$, $S'_{12}$, ..., $S'_{mn}$ can be configured with a first terminal $A_{11}$, $A_{12}$, ..., $A_{mn}$, respectively, coupled to one of the n word lines $WL_1$, $WL_2$, ..., WLn, and a second terminal $B_{11}$, $B_{12}$, ..., $B_{mn}$, respectively, which is further coupled to one of the m bit lines $BL_1$, $BL_2$, ..., BLm. To simplify this disclosure and to avoid overcrowding the diagram, access devices are not depicted in FIG. 2.

In a number of embodiments, each non-volatile memory cell $S'_{11}$, $S'_{12}$, ..., $S'_{mn}$ is an SOT MRAM non-volatile memory cell. Low-power, fast-response machine learning techniques that can be utilized in accordance with embodiments of the disclosure are described in U.S. application Ser. Nos. 17/172,155, 17/172,175, and 17/172,190, which are hereby incorporated by reference in their entirety. In various embodiments, and as outlined in the above referenced related applications, it is contemplated that other configurations of cross-point memory arrays may be utilized. In various embodiments, and as outlined in the above referenced related applications, it is contemplated that other configurations of cross-point memory arrays may be utilized. For example, the cross-point array 200 depicted in FIG. 2 utilizes two-terminal SOT MRAM non-volatile memory cells while other configurations may utilize three-terminal cells.

In many embodiments, the cross-point memory array 200 can operate in a programming phase (for programming) and inferencing phase (for generating inferences). During the programming phase, each SOT MRAM non-volatile memory cell $S'_{11}$, $S'_{12}$, ..., $S'_{mn}$ can be programmed to store a corresponding weight of an nxm array of weights $w_{11}$, $w_{12}$, $w_{13}$, ..., $w_{nm}$, respectively. In particular, each SOT MRAM non-volatile memory cell $S'_{xx}$ is often programmed by applying electrical current pulses from first terminal $A_{xx}$ to second terminal $B_{xx}$. Both programming and inferencing phases can run current pulses from first terminal $A_{xx}$ to second terminal $B_{xx}$, but programming typically runs higher current than inferencing.

During inferencing, SOT MRAM non-volatile memory cells $S'_{11}$, $S'_{12}$, ..., $S'_{mn}$ of cross-point memory array 200 can be operated as described within the above related applications. In particular, during the inferencing phase each SOT MRAM non-volatile memory cell $S'_{11}$, $S'_{12}$, ..., $S'_{mn}$ conducts a memory cell current that corresponds to the result of multiplying one of the elements of the n-element input vector (multiply vector) by the corresponding weight stored in the non-volatile memory cell.

For example, SOT MRAM non-volatile memory cell $S'_{11}$ can conduct a memory cell current that corresponds to the product $Vin_1 \times w_{11}$, while SOT MRAM non-volatile memory cell $S'_{12}$ conducts a memory cell current that corresponds to the product $Vin_2 \times w_{12}$, and SOT MRAM non-volatile memory cell $S'_{23}$ conducts a memory cell current that corresponds to the product $Vin_3 \times w_{23}$, and so on.

During the inferencing phase, the memory cell currents in SOT MRAM non-volatile memory cells $S'_{11}, S'_{12}, \ldots, S'_{mn}$ can flow to the bit line $BL_1, BL_2, \ldots, BLm$ connected to the memory cell. Bit lines $BL_1, BL_2, \ldots, BLm$ may conduct bit line currents $Iout_1, Iout_2, \ldots, Iout_m$, respectively. Each bit line current is typically the summation of the memory cell currents of the memory cells connected to that bit line.

In the embodiments described above, cross-point memory arrays such as cross-point memory array 200 (FIG. 2) have been used to implement a single layer of an artificial neural network 100 that includes input neurons $x_1, x_2, x_3, \ldots, x_n$, output neurons $y_1, y_2, y_3, \ldots, y_m$, and synapses 102 that connect input neurons $x_1, x_2, x_3, \ldots, x_n$ to output neurons $y_1, y_2, y_3, \ldots y_m$. It is contemplated that multi-layer artificial neural networks may be implemented by cascading cross-point memory arrays so that an output of a first cross-point memory array can be used as one or more inputs to a second cross-point memory array, and so on.

In addition, in the embodiments described above, cross-point memory array 200 (FIG. 2) has been described as being configured to implement a binary neural network in which each SOT MRAM non-volatile memory cell in the array stores a binary weight, n binary inputs are applied to the first conductive lines, and m binary outputs are generated at the second conductive lines. It is further contemplated and would be understood by one skilled in the art that additional circuitry may be used to perform operations such as shift and add to achieve multiple-bit capabilities for the weight matrix for higher precision.

Without being bound by any particular scale, it is believed that embodiments of the cross-point memory arrays described above may achieve relatively fast speed as a result of various factors including, but not limited to, parallel in-memory computing without moving data between a processor and memory. Additionally, it is believed that many embodiments of the cross-point memory arrays described above may achieve relatively low power consumption due to the non-volatile memory nature of MRAM-like elements. This relatively low-power and fast-response can allow for unique and novel applications and improvements to computing devices and their associated technological field. For example, the following figures depict how these embodiments may be utilized to generate image calibration data when receiving and processing image data such as, but not limited to, pictures taken with a mobile computing device.

Figure 3:
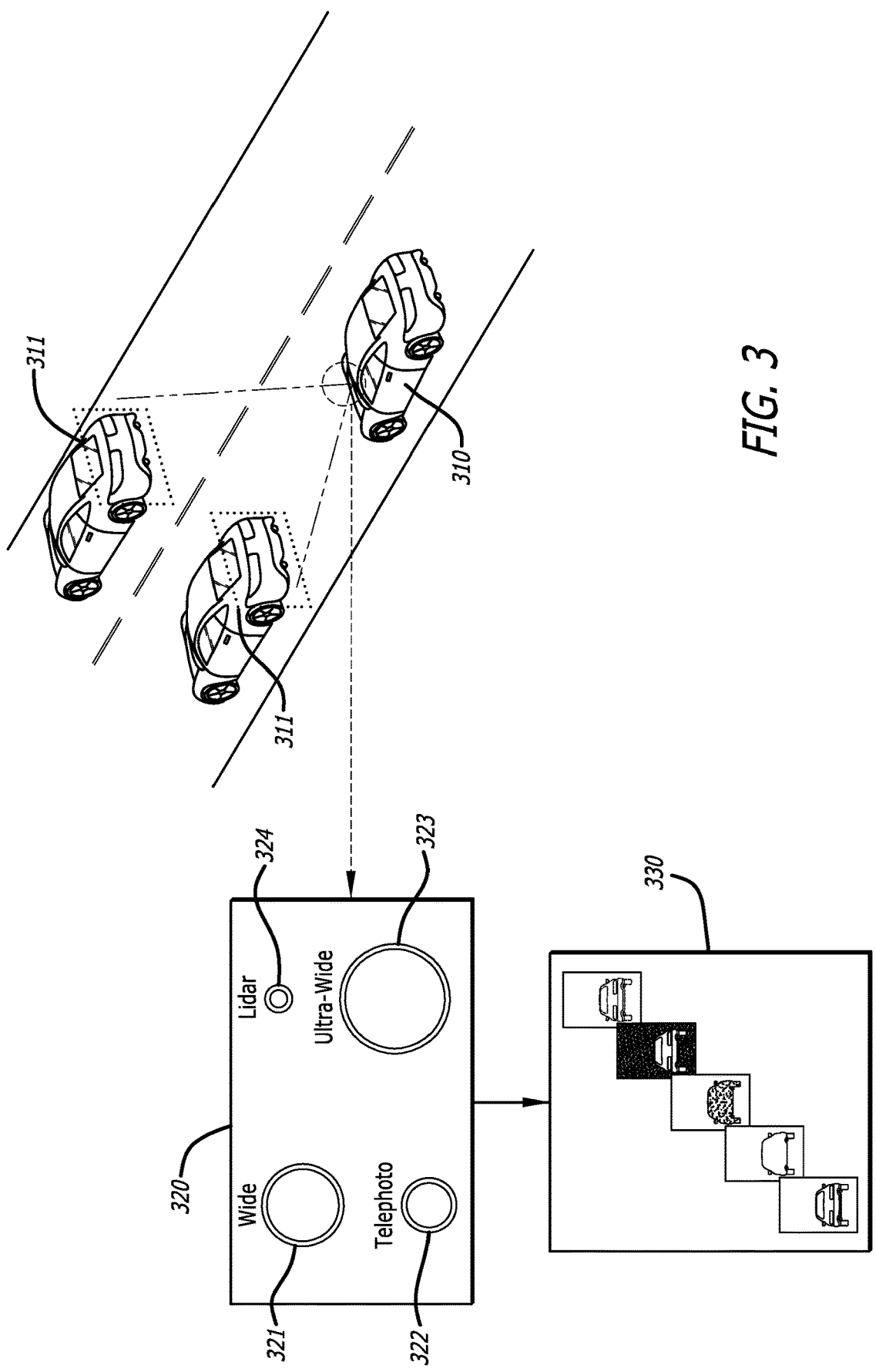
FIG. 3 depicts a conceptual process of capturing image data from an automobile suitable for variable compression in accordance with an embodiment of the disclosure.

Referring to FIG. 3, a conceptual process of capturing image data from an automobile 310 suitable for variable compression in accordance with an embodiment of the disclosure is shown. In many embodiments, variably compressed image data may be captured from an automobile 310 that is travelling. In these embodiments, the automobile 310 may attempt to recognize and track a variety of objects such as, but not limited to, other automobiles 311 that are also driving on the same road. As will be recognized by those skilled in the art, image data captured and analyzed for purposes of assisted driving require specialized attention to portions of the image area, while other portions (sky, background, etc.) do not require much, if any attention. This type of variable value in the areas captured within the image data is suitable for use in a variable compression system.

In a number of embodiments, the automobile 310 may include a sensor array 320 which can include, but is not limited to, a wide angle lens 321, a telephoto lens 322, and ultra-wide angle lens 323 and a Light Detection And Ranging (LIDAR) camera 324. Each of the lenses 321, 322, 323 may be directed to a single image sensor, or may each be associated with unique image sensors. The use of multiple lenses 321, 322, 333 and image sensor(s) allow for the capture of image data at various depths and focal lengths without the need for moving parts within the lenses 321, 322, 323. However, certain embodiments may benefit from the use of variable focal length lenses which may allow for a smaller footprint when disposing the image sensor array 320 on a device, such as an automobile 310. The exact deployment and configuration of the image sensor array 320 can vary depending upon the desired application.

In further embodiments, the image sensor array 320 can be utilized to capture a series of image data 330 for processing which can represent various aspects of the image to be captured. Depending on the number and/or types of sensors available in image sensor array 320, a series of image data captured can include, but is not limited to, an auto exposed image, an auto white balance image, an autofocused image, a noise reduced image, a local tone mapped image, a highlighted details image, a fused image, a face detected image, a facial landmarked image, a segmented image, and/or a depth image. In certain embodiments, one or more of the series of image data 330 can be generated based on other captured image data which may be internally generated by the image sensor prior to passing to the memory and/or processor of the automobile or other image capturing device. In further embodiments, the image capturing device may have a specialized system or logic to pre-process received image data to deliver additionally processed image data to the processor and/or memory for further processing.

Upon generation of the series of image data 330, one or more logics within the mobile computing device can determine if the image can be variably compressed and stored. In many embodiments described herein, the determination of the areas to variably compress and the amount of compression to apply to each area is based upon the analysis of one or more areas of the image data that are associated with their relative motion and/or whether they are a high-priority object. This determination of relative motion and priority can be made using one or more machine learning logics. Various embodiments of these machine learning logics are described in the subsequent discussion of FIGS. 4A-8.

Figure 4A:
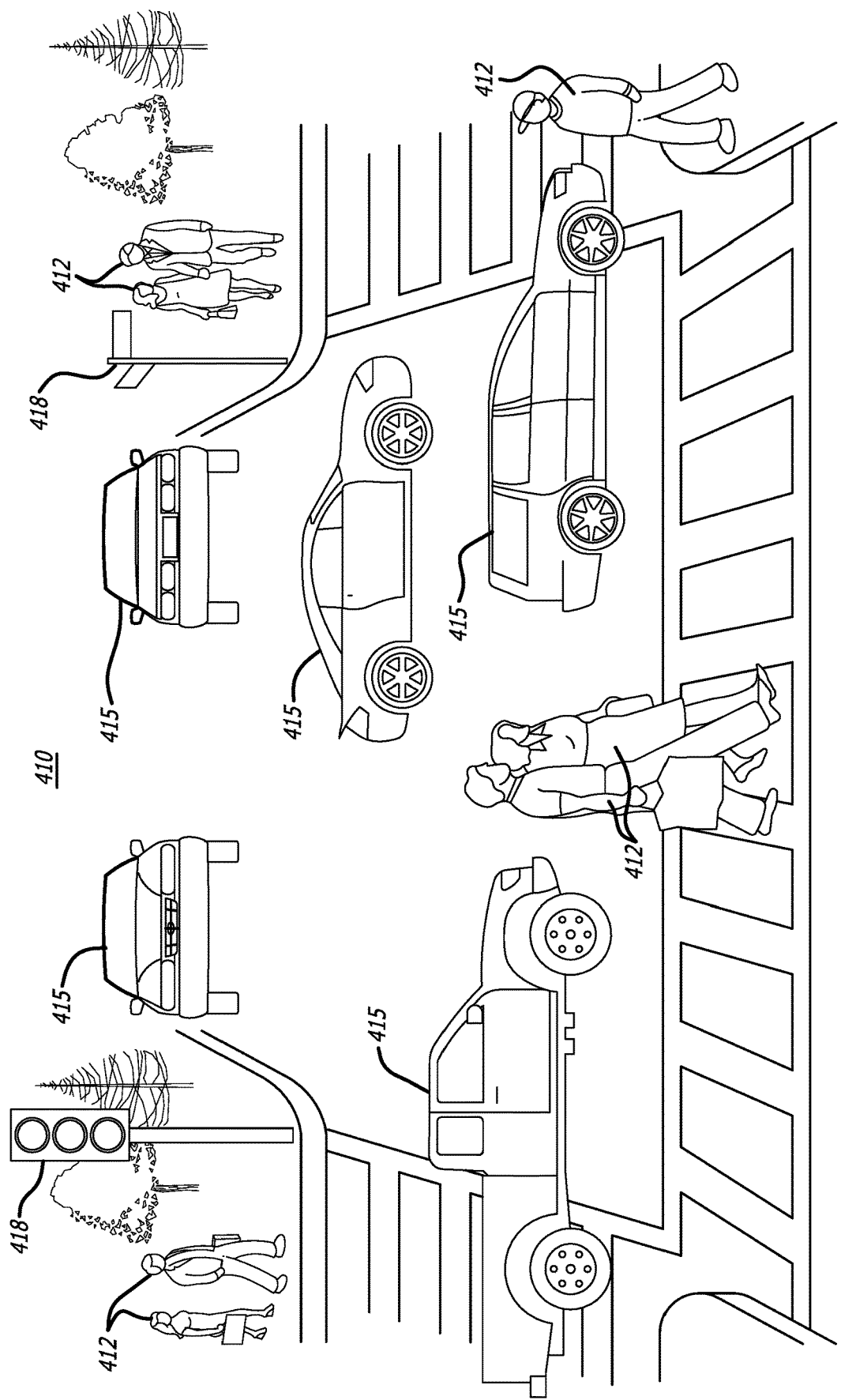
FIG. 4A is a conceptual illustration of a sample image within one or more sets of image data in accordance with an embodiment of the disclosure.

Referring to FIG. 4A, a conceptual illustration of a sample image 410 within one or more sets of image data in accordance with an embodiment of the disclosure is shown. Utilizing the example of an automobile capturing image data for use in one or more assisted driving features, the sample image 410 shows a scene which may be captured by an automobile while driving or parked at a stop light. In this sample image 410, there may be a number of items which will have unique levels of motion and or priority when processing. In the embodiment depicted in FIG. 4A, the sample image 410 comprises a number of pedestrians 412, other automobiles/vehicles 415, and landmark objects 418 such as street signs and traffic lights. Once captured, the sample image 410 may be processed by a low-power, fast-response machine learning logic. An example of an output of this logic can be seen in FIG. 4B.

Figure 4B:
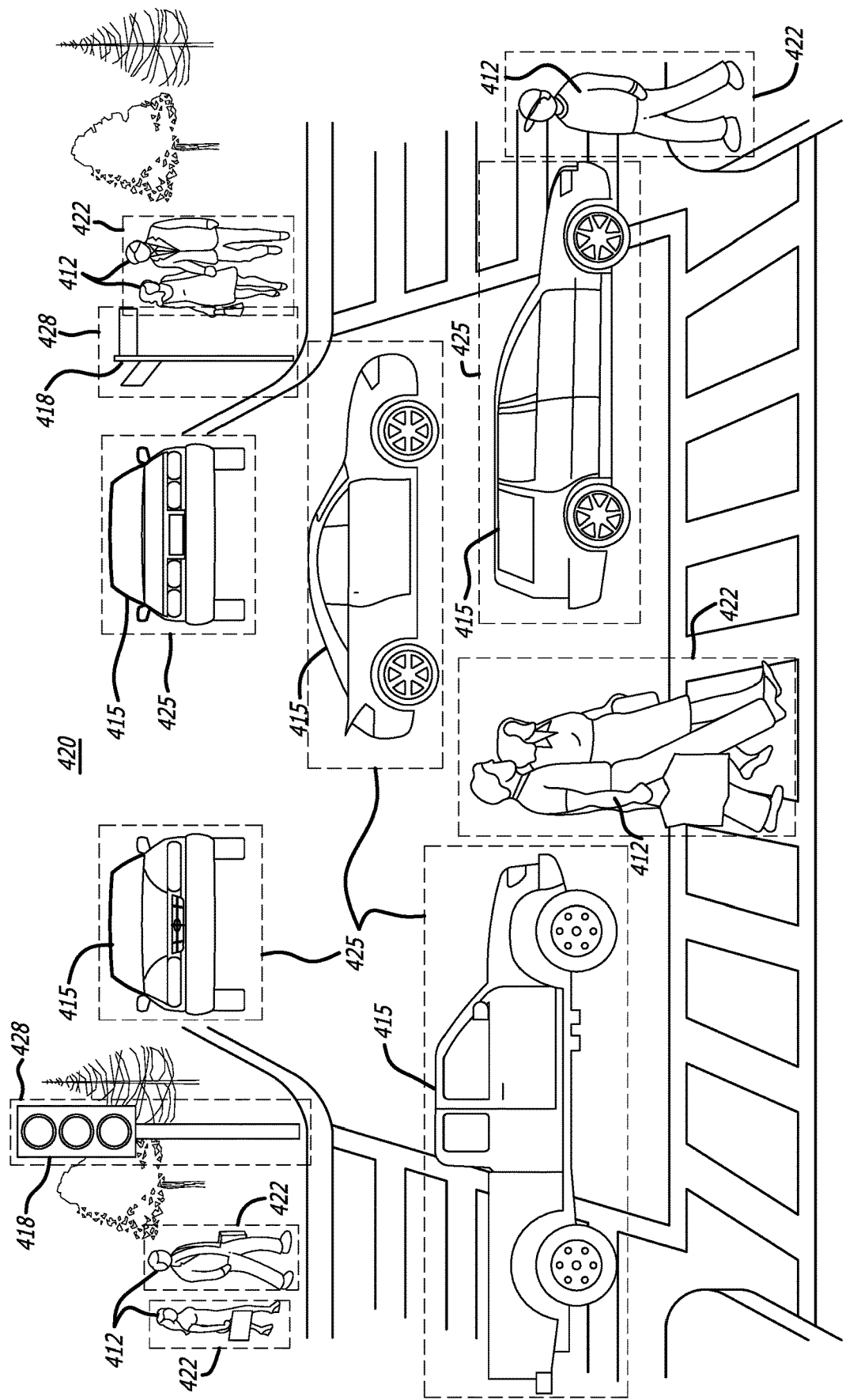
FIG. 4B is a conceptual illustration of a sample image within one or more sets of image data processed to recognize a plurality of subjects in accordance with an embodiment of the disclosure.

Referring to FIG. 4B, a conceptual illustration of a sample image 420 within one or more sets of image data processed to recognize a plurality of subjects in accordance with an embodiment of the disclosure is shown. In various embodiments, the automobile or other image processing device may analyze the sample image 420 and generate a plurality of bounding boxes 422, 425, 428 around detected subjects of interest such as, but not limited to, pedestrians 412, other automobiles/vehicles 415, and landmark objects 418 such as street signs and traffic lights. As those skilled in the art will recognize, the use of a bounding box 422, 425, 428 is not the only method of selecting an area of an image comprising a detected object. It is contemplated that an image mask, such as a pixel-level image mask may be suitable for use in segmentation a sample image 420.

In most embodiments, the bounding box 422, 425, 428 will be comprised of a rectangle that encases the detected object and has a size that includes the maximum height and width of the detected object. Based on the desired application and capabilities of the image capturing device, the generation of the bounding box 422, 425, 428 may be generated by a specialized logic or by the low-power, fast-response machine learning logic. Additionally, it is contemplated that each recognized subject within the sample image 420 may be segmented with a unique bounding box and/or image mask and may be grouped together based on recognized subject type. These groupings are shown in more detail within the embodiment depicted in FIG. 4C.

Figure 4C:
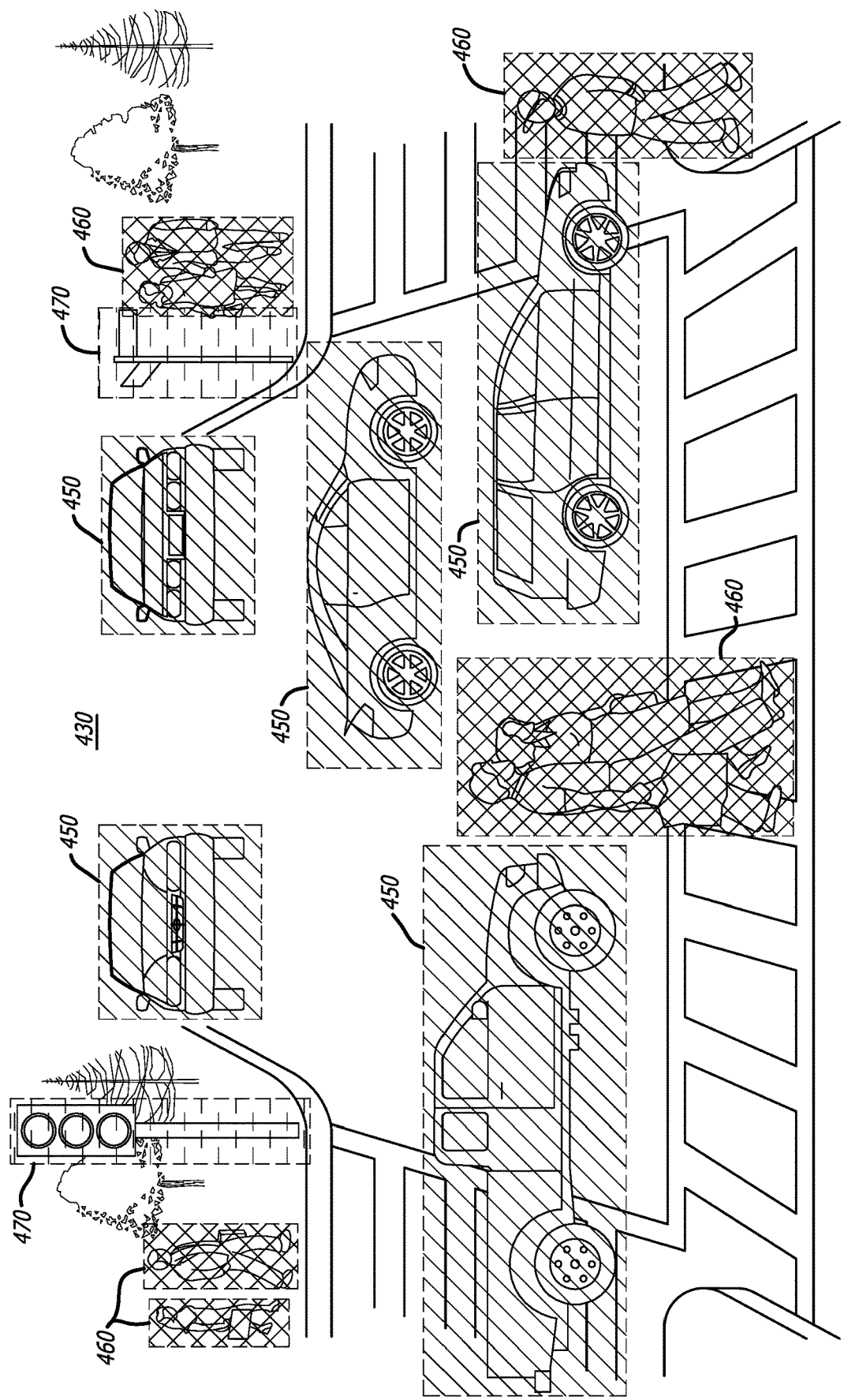
FIG. 4C is a sample image within one or more sets of image data processed to recognize a region of known subjects in accordance with an embodiment of the disclosure.

Referring to FIG. 4C, a sample image 430 within one or more sets of image data processed to recognize a region 450, 460, 470 of known subjects in accordance with an embodiment of the disclosure is shown. Once a subject has been detected, it may be grouped into one or more groupings. A grouping may be generated based on the overall motion of the detected subjects. In this way, there may be groupings for fast-moving subjects, slow-moving subjects, etc. Similarly, subjects may be grouped based upon the type of subject it is. Thus, irrelevant of the motion of the subjects, they may be grouped based on their relative priority to the task being performed by the image capturing device. For example, an automobile may detect one or more road signs within an image which will not have any recognized motion (other than relative to the travel of the automobile) but may still have a high-priority for detection and analysis due to its likely importance to the task of assisted driving.

Each of these groupings may be compressed at variable levels prior to storing the image data. In many embodiments, groupings that have a relatively high level of motion and/or are considered high priority subjects may have a lower level of compression assigned to them. Likewise, objects that determined to not be moving quickly between captured images or which are irrelevant (such as a background or areas within the image that are not within one or more bounding boxes), may have a higher level of compression assigned. It is contemplated that any level of compression may be assigned to any type of grouping based on the desired application.

Specifically, within the embodiment depicted in FIG. 4C, a determination was made that the other moving automobiles/vehicles comprise the same level of movement, thus generating a plurality of automobile regions 450 that will be grouped with a first compression level. Similarly, the pedestrians were analyzed to comprise a lower level of movement, and therefore has a second priority region 460 generated that is assigned to a medium level of compression. The street signs and traffic lights were detected and were determined to comprise high-priority regions 470 which would also be grouped with a lower compression level. In certain embodiments, the automobile region 450 and high-priority regions 470 may be grouped together as they may share a same compression level. Finally, the remaining portions of the sample image 430 which are not associated with one of the generated regions 450, 460, 470 may further be processed as a unique background region that may be assigned to a higher level of compression. The level of compression assigned to a background region may be predetermined based on a number of factors including, but not limited to, a value established prior to image capture, the amount of processing resources available, the amount of data storage available, and/or the amount of background determined within the image data being processed. Logics that can carry out these operations are discussed in more detail below.

Figure 5:
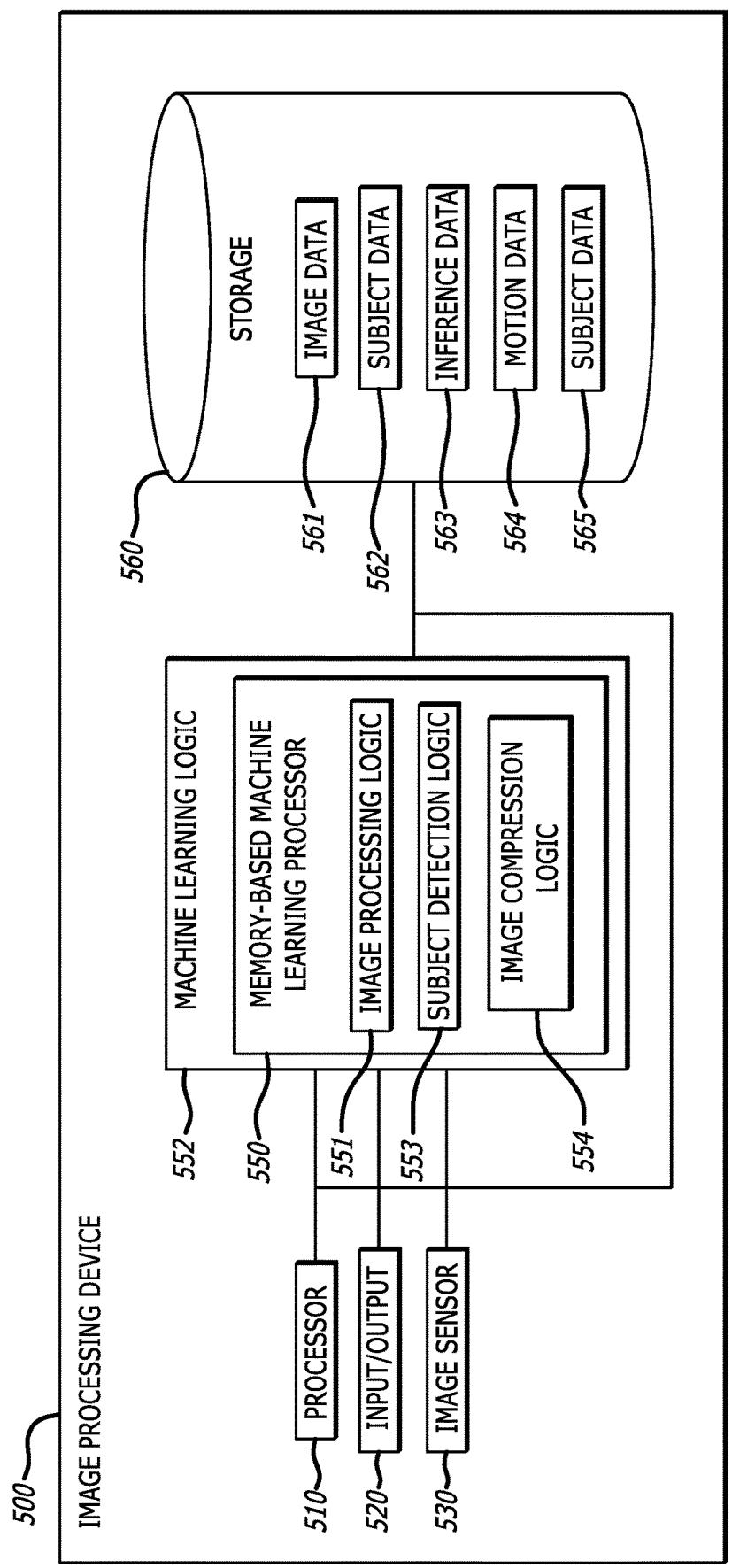
FIG. 5 is a conceptual schematic diagram of a device suitable for variably compressing image data utilizing low-power fast-response machine learning models in accordance with an embodiment of the disclosure.

Referring to FIG. 5, a conceptual schematic diagram of an image processing device suitable for variably compressing image data utilizing low-power fast-response machine learning models in accordance with an embodiment of the disclosure is shown. Various embodiments of the image processing device 500 can include components such as, but not limited to, a processor 510, an input and output module 520 which may include a plurality of data input and output pathways, an image sensor 530, a memory-based machine learning (ML) processor 550, and a storage 560. The memory-based ML processor 550 could be based on the cross-point memory array designs shown above, and could include associated control circuitry and analog-to-digital (ADC) to convert received digital signals into the analog domain for processing in the memory array, and digital-to-analog (DAC) to convert analog output from the memory array back into the digital domain. The memory-based ML processor 550 could be configured to implement a plurality of logics 551 and 553-554 while the storage 560 is configured to store a plurality of data 561-565.

In a number of embodiments, the memory-based ML processor 550 is part of and controlled by a machine learning logic 552 that can utilize one or more fast-response, low-power artificial neural networks to generate a plurality of inferences in a manner similar to the discussions of FIGS. 1A-2 above. In certain embodiments, the machine learning logic 552 can be a cross-point memory array of the memory-based ML processor 550, but further embodiments may also include hardware and/or software logic to format, parse, or otherwise input data 561 into the cross-point memory array and to process the resultant output. In still further embodiments, the machine learning logic 552 may be implemented as a specialized system on a chip SoC that is configured for optimized processing of image data 561.

The image sensor 530 may be configured in a variety of ways based on the application desired. In certain embodiments, the image sensor 530 may be an image sensor array comprising multiple lens and image sensor types. The image sensor 530 may be preinstalled image sensors on the device but may be an added component. By way of example, the image sensor 530 can include a wide lens, an ultra-wide lens, a telephoto lens, and a separate but integrated light detection and ranging (LiDAR) camera. The various lenses may be provided on a single image sensor or may be disposed individually on separate image sensors within an image sensor array. In some embodiments, the image sensor 530 can be externally or remotely connected to the image processing device 500.

In many embodiments, an image processing logic 551 can guide the image processing process through various steps. By way of example, the image sensor 530 can provide image data 561, or a series of image data 561 to the memory-based machine learning (ML) processor 550 and/or processor 510 for processing. The image processing logic 551 can pass and/or direct the received image data 561 to a machine learning logic 552 for the generation of a plurality of inferences, to the subject detection logic 553 for determining whether one or more subjects is within the image data 561 and their associated motion and/or priority. In various embodiments, the image processing logic 551 can determine if the received image data 561 is ready for compression, provide the image data 561 to the image compression logic 554 for variable compression, and when variably compressed, store the image data 561 within the storage 560.

In various embodiments, subject detection logic 553 may be configured to utilize available subject data 562 for recognizing a plurality of subjects within a set of image data 561 received for processing. The subject detection logic 553 may further be configured to create new subject data 562 by receiving input data from a user indicating a particular subject within a series of image data 561 is a subject suitable for recognition. In more embodiments, the subject detection logic 553 may be directed to comb through or otherwise access a data store of pre-processed images that may allow for the determination of one or more subjects suitable for recognition and priority sorting. For example, a user may allow the subject detection logic 553 access to a set of training data which may have multiple pictures or other data structures of subjects that are suitable for recognition and/or priority determination. By way of example, an automobile utilizing a subject detection logic 553 may be given access to new training data for street signs and/or traffic signals when travelling to a new region with different traffic-related signage. The subject detection logic 553 may also in certain embodiments be able to determine the frequency of encountered subjects and generate new subject data 562 that can be stored for future image data processing.

In further embodiments, image compression logic 554 can be utilized to process and compress image data 561 in various ways. In certain embodiments, the image compression logic 554 may have portions of image data 561 passed into it with a fixed level of compression, thus outputting statically compressed image data 561 which is then stitched together in another logic such as the image processing logic 551. In other embodiments, the image compression logic 554 may be directed to variably compress image data that is passed into it. The direction for variable compression may be generated within the image compression logic 554 or may be input as a direction from another logic such as the image processing logic 551. Image compression logic 554 may utilize a compression method that allows for multiple levels of compression on the same image data.

In most embodiments, image data 561 can include any data that is captured and/or provided by the image sensor 530. Image data 561 can also data that is captured over a time series to generate video data. Image data 561 can be standard pixel color data, but may include a variety of supplemental data that can be captured by an image sensor 530 and may also include metadata associated with data captured by an image sensor 530 or processed by the image processing device 500. As those skilled in the art will recognize, the image data 561 may be located in a storage 560 within the image processing device 500 or may be stored within a removable and/or remote (i.e., "cloud-based") storage system.

In additional embodiments, subject data 562 may include data that allows for the recognition of known subjects within image data 461 that is being processed. In some embodiments, the known subject data may be pixel data of various known subjects at differing angles, but may include other identifying data which may include, but is not limited to, segmentation data, or facial landmark data. As those skilled in the art will recognize, known subjects may not be limited to people and may be animals or other subjects that may be of interest to the user when capturing images.

In a number of embodiments, inference data 563 can be the output from one or more machine learning models processed by the machine learning logic 552. As discussed above, a fast-response, low-power machine learning system can be utilized to generate a plurality of inferences that can be grouped as inference data 563 for further processing. Inference data may be comprised of data that indicates the presence of a known subject within image data 461 or if the image data 461 is optimized, in-focus, etc. In some embodiments, the inference data 563 generated by the machine learning logic 552 may be immediately processed by another logic to generate further image optimization data 565 without being directly stored within the storage 560.

In still further embodiments, motion data 564 may indicate the current motion of the image sensor 530 or image processing device 400. In many embodiments, the motion data 564 is directly generated from a motion sensor 440 located within the image processing device 400 or adjacent/associated with the image sensor 530. Utilizing the motion data 564, the image processing logic 451 and/or the image sensor configuration logic 454 may account for movement during the image capture process which may inhibit the optimization of the image data 461. For example, the user may be moving the image processing device 400 (such as a mobile computing device) during image capture. This may create a blur or other distortions in the image data 461 being captured. The motion data 564 may be added to the inference data 563 in certain embodiments to generate image optimization data 565 which can attempt to compensate for this motion by issuing or modifying one or more image sensor configurations. Similar to other datas—561-563, 565 the motion data 564 may not be stored directly within the storage 560 of the image processing device 500 but may be directly generated and processed by one or more logics 551, 553-554 before being deleted.

In some embodiments, subject data 562 may comprise any data or metadata generated that can be associated with an identified subject within the image data 561. For example, the data required to identify the segmentation of a subject within the image data 561 can be stored as subject data 562. In further embodiments, the subject data may comprise data related to the group and/or region association of the identified subject, as well any associated compression level. Other examples of data that may be stored as subject data 562 include relative motion and/or direction values of the subject, priority status, and/or determined information (e.g., traffic sign data, traffic light status data, other traffic related data, etc.). It is contemplated that other data and data types may be stored as subject data 562 as needed for the desired application.

Figure 6:
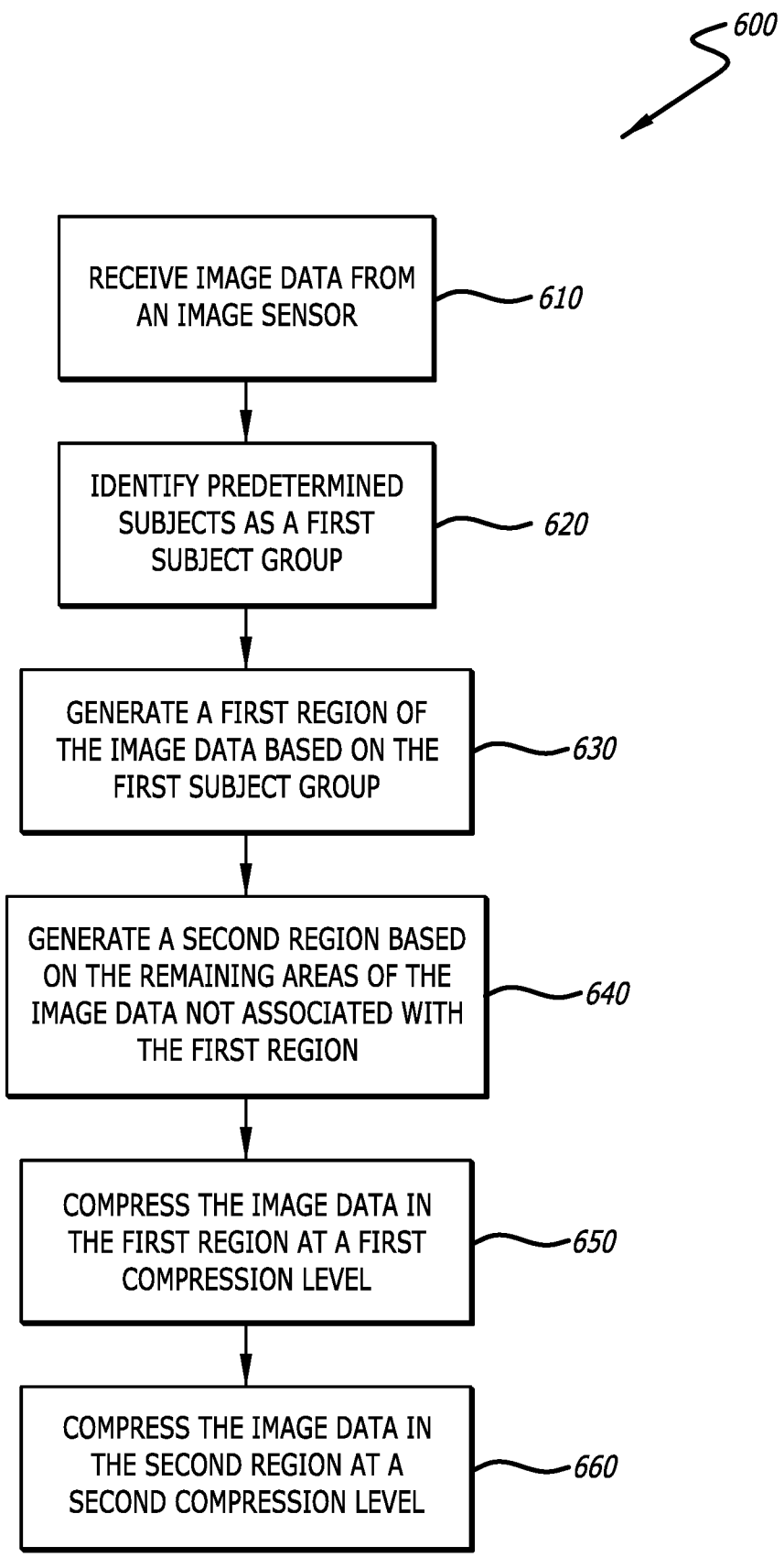
FIG. 6 is a flowchart depicting a process for generating variably compressed image data in accordance with an embodiment of the disclosure.

Referring to FIG. 6, a flowchart depicting a process 600 for generating variably compressed image data in accordance with an embodiment of the disclosure is shown. In many embodiments, the process 600 can begin upon receiving image data from an image sensor (block 610). As described above, image data can come from a variety of image sensors, or an image array configured with a plurality of image sensors. The image data can be analyzed and/or pre-processed in a variety of ways. In a number of embodiments, the image data is processed to identify one or more predetermined subjects as a first subject group (block 620). For example, as described in the embodiments depicted in FIGS. 4A-4C, image data may be processed to determine a pedestrian subject group comprising one or more subjects, an automobile/vehicle group comprising other automobiles, motorbikes, or other moving vehicles, and/or a traffic indicator/high-priority group which comprises one or more subjects relevant to driving such as traffic signs, traffic lights, street signs, and/or the like. In certain embodiments, the subject groups may not be determined, but generate a unique classification for each of the subjects identified.

The process 600 can further process the image data to generate a first region based on the first subject group (block 630). As discussed previously, the region may be generated in a variety of ways, including, but not limited to, combining a plurality of bounding boxes that are generated around each of the identified subjects within a subject group. In further embodiments, a region may be generated by combining a plurality of pixel masks that are generated over each of the identified subjects within a subject group. In still further embodiments, the region may include a single subject and accompanying bounding box or pixel mask.

In various embodiments, the process 600 can generate a second region based on the remaining areas of the image data not associated with the first region (block 640). In these embodiments, the process 600 can be understood as parsing one or more subjects into the first region and the areas not associated with any identified subject (i.e., the background) into the second region. As described in more detail below, additional embodiments may generate more than two regions and could create more than two regions. In fact, the number of regions may only be limited by the available processing resources and/or subjects identified within the image data.

Upon generation of at least two regions, the process 600 can compress the image data in the first region at a first compression level (block 650). The selected compression level can be based on a number of factors including, but not limited to, relative determined motion of the subjects within the region, the determined importance of the identified subjects for the desired application, the complexity of the subjects within the region, and/or the region of the image within the image data. Similarly, the process 600 may compress the image data in the second region at a second compression level (block 660). In the embodiments described above, the second compression level is higher than the first compression level as the second region is of the background (and hence of lower importance) than the first region comprising the previously identified subjects. However, it is contemplated that various embodiments may include second compression levels that are lower than the first compression level depending on the desired application. As described in more detail in the discussion of the figures below, embodiments may include a larger number of regions and/or complexity in the determined level of compression.

Figure 7:
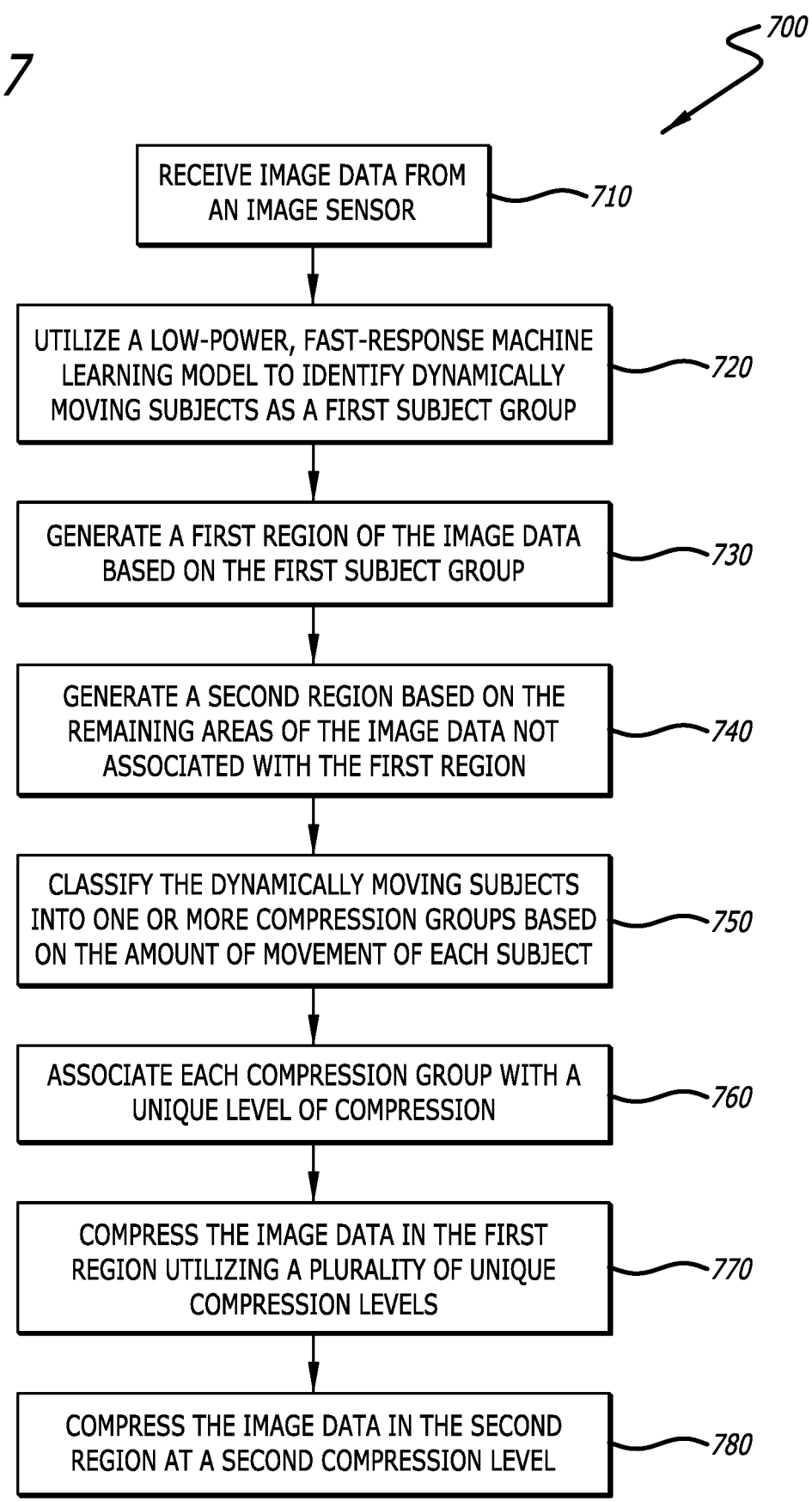
FIG. 7 is a flowchart depicting a process for utilizing a fast-response, low-power machine learning logic to variably compress image data in response to recognized subject motions in accordance with an embodiment of the disclosure.

Referring to FIG. 7, a flowchart depicting a process 700 for utilizing a fast-response, low-power machine learning logic to variably compress image data in response to recognized subject motions in accordance with an embodiment of the disclosure is shown. As previously discussed, many embodiments of the process 700 can begin upon receiving image data from one or more image sensors (block 710). These image sensors can be disposed upon one or more image arrays.

In a number of embodiments, the process 700 can utilize a low-power, fast-response machine learning model to identify dynamically moving subjects as a first subject group (block 720). The machine learning models may be a part of a machine learning logic such as those discussed in the embodiments associated with FIG. 5. In various embodiments, the low-power, fast-response machine learning models may be implemented similarly to the embodiments described in FIGS. 1A-2. Often, the identification of dynamically moving subjects within the image data is done at a rate that can allow for the processing of video images as they are captured in real time or near real time. The detection of dynamically moving objects can be accomplished in certain embodiments by analyzing detected objects between multiple image data captures (such as various adjacent frames of video) and determining a difference between their location with the image data frame.

In additional embodiments, the first subject group identified can be utilized to generate a first region of the image data (block 730). The region can be based on various segmentation methods such as, for example, bounding rectangles and/or pixel masks. In some embodiments, the region may be comprised of one or more discontinuous areas within the image data. However, in further embodiments, the region can be configured as a single contiguous area within the image data. In still further embodiments, the single contiguous area is generated by stitching together the segmentation areas around each identified moving subject. In still yet further embodiments, the region can be generated by stitching together the segmentation areas around each identified moving object and subsequently expanding one or more portions of the segmentation areas until a single contiguous region is generated.

In response to the generation of a first region within the image data, the process 700 can generate a second region based on the remaining areas of the image data not associated with the first region (block 740). In other words, areas of the image data that are not within the first region can be automatically classified within a second region. Often, this can be done for the processing of backgrounds from moving subjects. It is contemplated that certain embodiments may utilize additional regions prior to generating a region based on areas not previously associated with previously generated regions. For example, an automobile may generate a first region based on detected moving subjects, and then generate a second region based on detected high-priority subjects such as traffic lights and traffic signs that may not be moving. Then, the final region is subsequently generated based on areas not previously associated with the first or second region. Thus, the number of regions generated may be greater based on the desired application and may only be limited by the areas captured within the image data.

Upon generation of the multiple regions, the process 700 can classify the dynamically moving subjects into one or more compression groups based on the movement of each subject (block 750). As discussed above, some embodiments may simply group all identified moving subjects to a single compression group. However, a number of embodiments may further classify (or sub-classify) the identified moving subjects into further categories of movement that each may be associated with a unique compression group. As described in more detail below in the discussion of FIG. 9, a method of variable compression may include classifying various classes of moving objects based on their speed (e.g., slow, medium, and fast moving objects), and then compressing the associated image data at a unique rate for each of those classes.

In particular embodiments, the classification of the plurality of groups can be done by a low-power, fast-response machine learning model. In certain embodiments, the classification of dynamically moving subjects is done prior to the generation of the first region and subsequently creates multiple regions during the initial image data analysis. It is contemplated that the specific order of image data analysis, subject identification, region creation, and compression group classification can occur at various stages within the process 700 depending on the desired application.

Once one or more classification of compression groups occurs, the process 700 can associate each compression group with a unique level of compression (block 760). As a result, the first region will comprise a plurality of areas associated with various compression groups and levels of compression. In other embodiments, the process 700 can instead process each level of compression with a unique region within the image data instead of multiple compression groups and/or levels being within the same region. For example, the first region of dynamically moving subjects can be comprised of slow, medium, and fast moving subjects that each have a different level of compression associated with each category of moving subject.

Once associated, the process 700 can compress the image data in the first region utilizing a plurality of unique compression levels (block 770). The compression can occur utilizing a variety of compression methods. As those skilled in the art will recognize, compression levels can typically be associated with overall aggressiveness in compression such that higher levels of compression are associated with applying more compression that reduces overall data size, but creates more lossy data, while lower compression levels retain more data compared to the higher compression levels, but at a cost of increasing the overall resulting data size.

Upon completion, during, or prior the compression of the first region, the process 700 can also compress the image data in the second region at a second compression level (block 780). Often, the second region may comprise background of otherwise less important image data and can be compressed at a predetermined compression level that is more aggressive than the compression levels utilized in the first region, or a region associated with moving or high priority subjects. As suggested above, the second region may instead be a last region that is generated upon the completion of other regions that were previously generated. In certain embodiments, the second compression level may be a predetermined threshold level that is known to be associated with the background or non-identified areas of the image data. Often, the second compression level is higher than the first compression level, however, this is not required and may vary based on the desired application.

Figure 8:
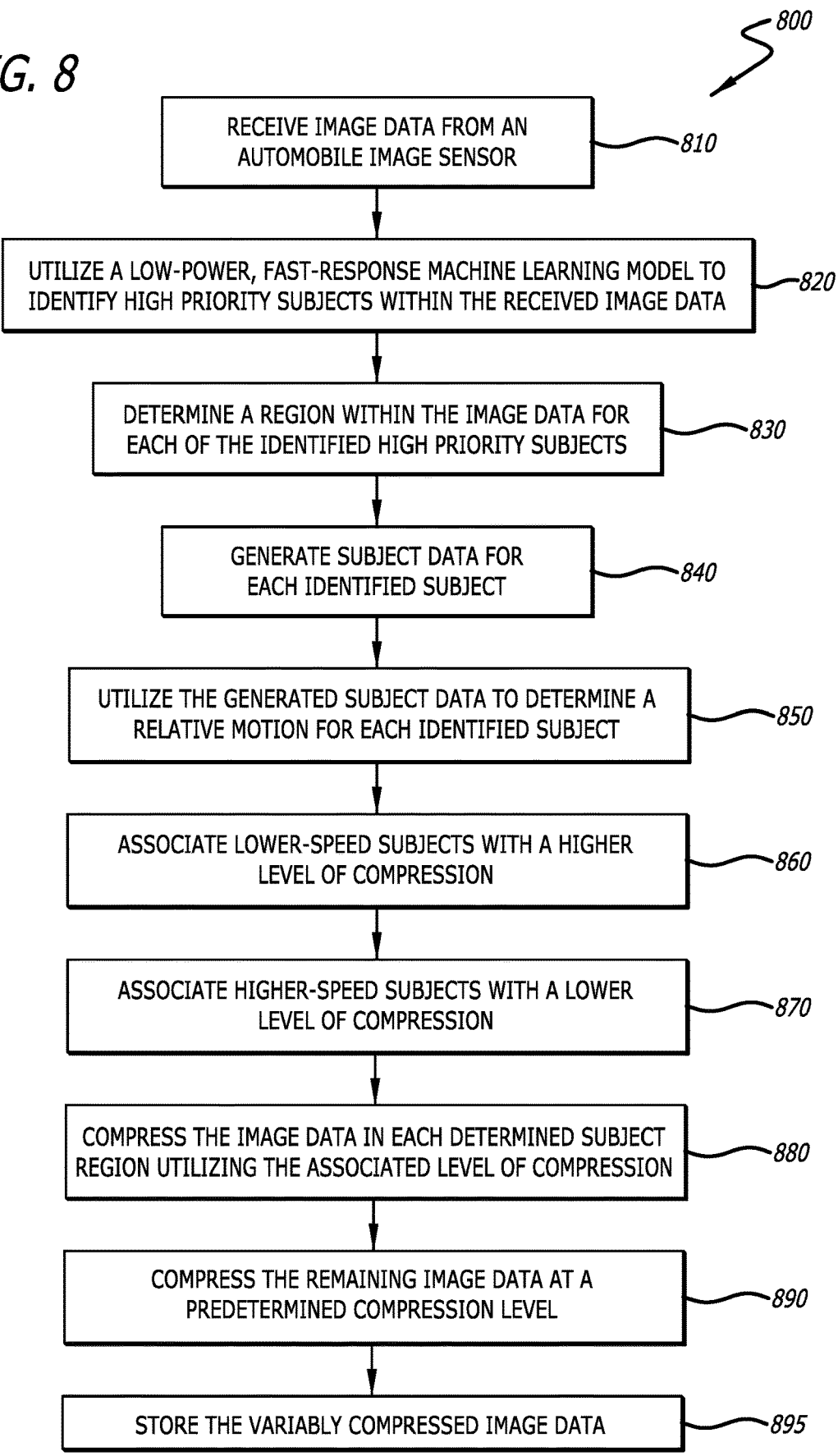
FIG. 8 is a flowchart depicting a process for utilizing a fast-response, low-power machine learning logic to variably compress image data based on recognized high priority subjects captured from an automobile in accordance with an embodiment of the disclosure.

Referring to FIG. 8, a flowchart depicting a process 800 for utilizing a fast-response, low-power machine learning logic to variably compress image data based on recognized high priority subjects captured from an automobile in accordance with an embodiment of the disclosure is shown. A unique application of various embodiments disclosed herein occurs in an automobile that is processing image data for various purposes such as assisted driving. Often, automobiles or other vehicles may be equipped with an image sensor array that includes a variety of lenses and cameras to capture a plurality of image data.

For these embodiments, the process 800 can begin upon receiving image data from an automobile image sensor (block 810). The image data can be captured in a variety of ways. For example, the image sensor can be disposed within an image sensory array that can capture image data from multiple angles, and at multiple focal lengths as needed to provide sufficient assisted driving image data. Then, the captured image data can be utilized by a low-power, fast-response machine learning model to identify high priority subjects (block 820). As opposed to identifying solely moving subjects as in the embodiments described in FIG. 7, the identification utilized within these embodiments can search for subjects that provide relevant information for the assisted driving process. These may include, but are not limited to, pedestrians, other vehicles, and/or traffic signs/lights, etc. As described above, the low-power, fast-response machine learning logic can be a logic as described within FIG. 5, and/or may be implemented in a similar manner to the methods described in FIGS. 1A-C.

Various embodiments can determine a region within the image data for each of the identified high priority subjects (block 830). As described above, each subject may be encased or segmented by utilizing something like a bounding box/rectangle or a pixel mask. In these embodiments, the image data can be comprised of a plurality of regions as each subject may be considered to have its own region, unless it overlaps with another subject. The process 800 can also generate subject data for each identified subject (block 840). This step may occur at various points within the process 800. Indeed, some embodiments may generate subject data simultaneously, or contemporaneously with the initial identification or the subsequent region determination. Subject data may include any type of data that can attributed to the identified subject. For example, subject data may include motion vector data that can be utilized in subsequent image data analysis, information recognized from traffic lights or other signage, likelihood of future movement (e.g., small children can change location quickly while traffic signs will not typically move), etc.

In many embodiments, the subject data can be utilized to determine a relative motion for each of the identified subjects (block 850). The motion of each subject can be determined utilizing subject data which may include data that was previously generated while analyzing previous image data. As those skilled in the art will recognize, determining motion of subjects within an image can be accomplished utilizing a variety of methods such as comparing the location of the subject in the current image data with the location of the same subject in previous image data. In certain embodiments, the process 800 can also analyze subject data that includes analysis of location and other data from subsequent image data by processing image data in batches which can allow for certain image data to be compared to past and future captured images. In additional embodiments, other determinations about the identified subjects may be determined based on the subject data as well.

Once the relative motion of identified subjects is known, the process 800 can associate lower-speed subjects with a higher level of compression (block 860). As discussed above, utilizing higher levels of compression can lead to an overall decrease in data size, however data (such as, for example, resolution, framerate, etc.) is more likely to be lost. For lower-speed subjects, the chance for capturing pertinent information is increase, such that a potential loss of data is less risky. Conversely, the process 800 can associate higher-speed subjects with a lower level of compression (block 870). When a subject is moving relatively fast, it may pose more of a threat or danger to the assisted driving process. As a result, more data related to the subject will want to be retained, thus leading to the desired use of a lower level of compression.

When each region within the image data is associated with a higher or lower level of compression, the process 800 can compress the image data in each determined subject region utilizing those associated levels of compression (block 880). The resulting image data may comprise a patchwork of regions that can have varying amounts of compression applied. However, in most embodiments, a remaining image data area will remain uncompressed. However, the process 800 can compress that remaining image data at a predetermined compression level (block 890). The predetermined level of compression may be, but is not required to be, higher than the compression levels utilized for the identified subject regions. The amount of compression can vary depending on the application and location of the data once processing is completed. In a number of embodiments, the variably compressed image data can be stored for future processing (block 895). In additional embodiments, the variably compressed image data is stored within a storage device of the automobile/vehicle. However, various embodiments may store the data within a cloud-based service or other remote storage device.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A device, comprising:
   an image sensor;
   a Non-Volatile Memory (NVM); and
   one or more processors communicatively coupled to the NVM, wherein the one or more processors are collectively configured to direct the device to:
   receive image data from the image sensor for processing;
   pass the received image data to a machine learning model;
   recognize a plurality of subjects within the image data;
   determine a region for each recognized subject;
   classify the recognized subjects into one or more speed classifications;
   generate a plurality of compression groups based on the speed classifications;
   select a unique level of compression for each of the one or more compression groups;
   compress the region of image data associated with each recognized subject according to the selected level of compression for the classified compression group;
   compress at least a portion of the remaining image data utilizing a predetermined level of compression, the predetermined level being different from a selected unique level of compression associated with one of the one or more compression groups; and
   store the variably compressed image data in the NVM.

2. The device of claim 1, wherein the one or more compression groups are based on the relative motion of the recognized subjects.

3. The device of claim 1, wherein the one or more processors comprise a machine learning processor comprising a plurality of non-volatile memory cells configured to store weights for the machine learning model, and wherein the machine learning processor is configured to apply signals corresponding to the received image data, via one or more signal lines associated with the memory cells, to the memory cells, to generate a plurality of inferences for processing the image data.

4. The device of claim 3, wherein the non-volatile memory cells are Spin-Orbit Torque Magnetoresistive Random-Access Memory (SOT MRAM) memory cells.

5. The device of claim 1, wherein the classification of the recognized subjects utilizes previously processed image data.

6. The device of claim 1, wherein the one or more processors are further collectively configured to direct the device to generate subject data for each recognized subject.

7. The device of claim 6, wherein the subject data comprises subject size, subject motion speed, or subject motion direction.

8. The device of claim 7, wherein the classification of the recognized subjects utilizes previously generated subject data.

9. The device of claim 1, wherein the predetermined level of compression is a higher level of compression than the selected unique levels of compression.

10. The device of claim 1, wherein the determined region is a bounding box encasing the recognized subject.

11. The device of claim 1, wherein the determined region is a pixel mask covering the recognized subject.

12. The device of claim 1, wherein the image sensor is disposed on an automobile.

13. The device of claim 12, wherein the image sensor comprises a plurality of varying focal length image sensors.

14. The device of claim 13, wherein the image sensor further comprises a Light Detection and Ranging (LiDAR) camera.

15. The device of claim 14, wherein the recognized subjects are high-priority subjects associated with automobile driving.

16. The device of claim 15, wherein the high-priority subjects include pedestrians, automobiles, or traffic signs.

17. The device of claim 1, wherein the variably compressed image data is streamed to a cloud-based computing device.

18. A method for variably compressing image data, comprising:
   receiving image data;
   passing the received image data to a machine learning model;
   processing the image data within the machine learning model to generate a plurality of inferences;
   utilizing the generated inferences to:
     recognize a plurality of dynamically moving subjects within the image data;
     generate a region of image data for each recognized subject;
     determine the relative speed of each recognized subject;
     generate two or more speed classifications based on the relative speed; and select a level of compression for each of the plurality of subjects based on the determined speed classifications;

compressing each generated region of image data according to the selected level of compression associated with the corresponding subject; and compressing at least a portion of the remaining image data utilizing a predetermined level of compression, the predetermined level being different from the selected level of compression for at least one of the plurality of recognized subjects.

19. The method of claim 18, wherein the machine learning model is processed with a machine learning processor comprising a plurality of non-volatile memory cells to store weights for the machine learning model, and wherein the machine learning processor is configured to apply signals corresponding to the received image data, via one or more signal lines associated with the memory cells, to the memory cells, to generate the plurality of inferences.

20. The method of claim 19, wherein the non-volatile memory cells are Spin-Orbit Torque Magnetoresistive Random-Access Memory (SOT MRAM) memory cells.

21. The method of claim 18, wherein the plurality of inferences is generated in less than one millisecond.

22. The method of claim 18, wherein the selected levels of compression are grouped into one or more categories.

23. The method of claim 22, wherein the one or more categories are associated with a range of determined speeds and a corresponding compression level.

24. A device, comprising:
one or more processors collectively configured to direct the device to:
receive image data for processing;
pass the received image data to a machine learning model;
recognize two or more subjects within the image data;
classify a first subject based on a first detected speed of the first subject;
classify a second subject based on a second detected speed of the second subject, wherein the second detected speed is different than the first detected speed;
generate a first region of the image data based on the recognized subjects;
generate a second region of the image data comprising the remaining image data;
compress the image data in the first region at a first compression level based on the classifications of the first subject and the second subject; and
compress the image data in the second region at a second compression level different from the first compression level.

25. The device of claim 24, further comprising a Non-Volatile Memory (NVM) communicatively coupled to the one or more processors, wherein the one or more processors are further collectively configured to cause the device to store the variably compressed image data in the NVM.

26. The device of claim 24, wherein the one or more processors are further collectively configured to direct the device to send the variably compressed image data to a cloud-based computing device.

* * * * *